United States Patent [19]

Honjo

[11] Patent Number: 4,703,343
[45] Date of Patent: Oct. 27, 1987

[54] NOISE REDUCTION FEEDBACK TYPE COMB FILTER

[75] Inventor: Masahiro Honjo, Neyagawa, Japan

[73] Assignee: Matsushita Electric Industrial Co., Ltd., Kadoma, Japan

[21] Appl. No.: 810,689

[22] Filed: Dec. 18, 1985

[30] Foreign Application Priority Data

Dec. 25, 1984 [JP] Japan .................................. 59-277167
Apr. 25, 1985 [JP] Japan .................................. 60-89216
Apr. 25, 1985 [JP] Japan .................................. 60-89217

[51] Int. Cl.$^4$ ........................................... H04N 5/213
[52] U.S. Cl. ....................................... 358/36; 358/107
[58] Field of Search .................. 358/31, 36, 328, 329, 358/167

[56] References Cited

U.S. PATENT DOCUMENTS

| 3,836,707 | 9/1974 | Murakami et al. | 358/36 |
| 4,291,330 | 9/1981 | Hirai | 358/328 |
| 4,302,768 | 11/1981 | Kamura et al. | 358/36 |
| 4,575,760 | 3/1986 | Nakagaki et al. | 358/36 |

FOREIGN PATENT DOCUMENTS

| 60186 | 5/1981 | Japan | 358/36 |
| 57-160287 | 10/1982 | Japan | |
| 223973 | 12/1983 | Japan | 358/328 |
| 54579 | 3/1985 | Japan | 358/36 |
| 69997 | 4/1985 | Japan | 358/36 |

OTHER PUBLICATIONS

"Sony—New Systems for Video Processing ICs", N. Yamashita, J. Hirai, K. Yamagiwa, and S. Saiki, Jun. 8, 1983, pp. 1-15.

Primary Examiner—John W. Shepperd
Attorney, Agent, or Firm—Wenderoth, Lind & Ponack

[57] ABSTRACT

A comb filter which shows a comb filter characteristic when a vertical correlation of an input signal is large and allows the input signal to pass as is when the vertical correlation is small includes a delay circuit for delaying the input signal by a predetermined time to obtain a delayed signal, a vertical correlation detecting circuit for detecting the vertical correlation of the input signal from the input signal and the delayed signal and for outputting a vertical correlation signal corresponding to the vertical correlation when the vertical correlation is large but not outputting any signal when the vertical correlation is small, and an operational circuit for operating upon the input signal and an output signal of the vertical correlation detecting circuit to obtain an output signal of the comb filter. Another operational circuit for operating upon the input signal and a predetermined feedback signal obtained from the vertical correlation detecting circuit and for supplying the result to the delay circuit may be provided before the delay circuit to construct a feedback type comb filter. Furthermore, the input signal may be passed through another delay circuit before being supplied to the operational circuit for outputting the output signal so that an undesired time delay produced within the filter can be compensated for.

20 Claims, 12 Drawing Figures

NOISE REDUCTION FEEDBACK TYPE COMB FILTER

BACKGROUND OF THE INVENTION

1. Field of the Invention

The present invention relates to comb filters each having comb-like frequency spectrum characteristic, and more particularly to a comb filter which is effective when used in the color signal processing circuit of video tape recorders (VTRs).

2. Description of the Prior Art

In recent years, feedback type comb filters have been used in color signal processing of VTRs. A typical example of the feedback type comb filters in the prior art as shown in FIG. 11 is disclosed in Japanese laid-open patent application No. 57-160287 (1982) and "Sony, New Systems for Video Processing ICs" by Noriyuki Yamashita et al, IEEE International Conference on Consumer Electronics, June 8, 1983. Referring to FIG. 11, input carrier color signal Cin reproduced from a magnetic tape is supplied through an input terminal 21 to an operational circuit 22. A signal C1 from the operational circuit 22 is supplied to operational circuits 25 and 26, and a 1H delay line 23 (H: horizontal scanning period). The operational circuit 26 subtracts a signal Cd from the 1H delay line 23 from the signal C1 from the operational circuit 22 to obtain an output color signal Cout which is transmitted to an output terminal 27. The operational circuit 25 adds the signal Cd from the 1H delay line 23 and the signal C1 from the operational circuit 22 to obtain a sum signal C2. The sum signal C2 is supplied through a feedback circuit 24 to the operational circuit 22.

FIG. 12 shows frequency characteristic curves of the feedback type comb filter shown in FIG. 11. When the feedback amount is 0, the comb filter shows a characteristic curve of a conventional comb filter as shown by curve a. When the feedback amount is large, it shows a characteristic curve of a feedback type comb filter as shown by curve c for example. If the feedback amount is properly adjusted, it shows characteristics between the curve a and the curve c (for example, curve b).

In the case of the curve c, chroma S/N is largely improved, but color shift or color leakage at a contour of a color image becomes large. In order to remove this defect, vertical correlation of the luminance signal is detected utilizing the fact that correlation between the luminance signal and the chroma signal is large, and the feedback amount of the chroma signal is controlled according to the vertical correlation of the luminance signal. This control is performed by a block 31 in FIG. 11. A reproduced luminance signal Y inputted to an input terminal 30 is passed through a 1H delay line 28 to obtain a delayed signal Yd, and a difference between the signal Yd and the signal Y is detected by an operational circuit 29 to obtain a signal Y1 indicative of the vertical correlation of the luminance signal. When the absolute value of the signal Y1 from the operational circuit 29 is large, the feedback amount of the feedback circuit 24 is made small so as to decrease the color leakage. When the absolute value is small, the feedback amount is made large so as to improve the chroma S/N.

In the above-mentioned configuration, however, such a premise is necessary that the correlation between the luminance signal and the chroma signal is quite large. If the correlation is small, a large color shift in the vertical direction is produced, so that the picture quality is largely deteriorated. Even when the correlation between the luminance signal and the chroma signal is large, since the configuration is similar to that of conventional comb filters, the color leakage is produced during 1H period in principle.

SUMMARY OF THE INVENTION

An object of the present invention is to provide a comb filter which shows a usual comb filter characteristic when the vertical correlation of an input signal is large so as to enhance S/N improvement effect, and hardly causes band deterioration of the signal in the vertical direction when the vertical correlation is small.

Another object of the invention is to provide a comb filter in which a time delay generated at inner circuit elements is compensated.

In order to attain the above objects, a comb filter of the invention comprises a delay means for delaying an input signal by a predetermined time to obtain a delayed signal, a vertical correlation detecting means for detecting a vertical correlation of the input signal from the input signal and the delayed signal and outputting a vertical correlation signal corresponding to the vertical correlation if the vertical correlation is large but not outputting any signal if the vertical correlation is small, and a first operational means for operating the input signal and an output signal of the vertical correlation detecting means thereby to obtain an output signal of the comb filter. According to this arrangement, the comb filter of the invention shows a usual comb filter characteristic when the vertical correlation of the input signal is large, and allows the input signal to pass as it is when the vertical correlation is small.

The vertical correlation detecting means may comprises, for example, a second operational means for operating the input signal and the delayed signal to obtain the vertical correlation signal, and a limiter for limiting the amplitude of the vertical correlation signal outputted from the second operational means.

If a third operational means is provided before the delay means, and a predetermined feedback signal is taken from the vertical correlation detecting means, and the third operational means is constructed to operate the input signal and the feedback signal and generate a feedback input signal which is supplied to the delay means, then a feedback type comb filter can be realized. If the vertical correlation detecting means is comprised by the second operational means and the limiter as described above, the feedback signal is obtained from an output of the second operational means or the limiter through a coefficient means or through a coefficient means and a second limiter.

Further, if the input signal is passed through a second delay means before being supplied to the first arithmetic means, an undesirable time delay generated in the components of the comb filter can be compensated.

The above and other objects, features and advantages of the present invention will become apparent from the following description taken in connection with the accompanying drawings in which:

DESCRIPTION OF THE PREFERRED EMBODIMENTS

Embodiments of the invention will now be described referring to the accompanying drawings.

Figure 1:
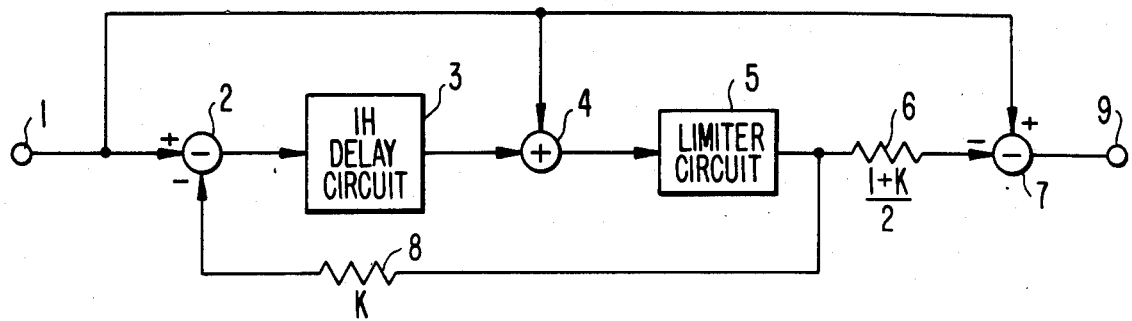
FIG. 1 is a block diagram of a first embodiment of the invention.

FIG. 1 shows a block diagram of a first embodiment of the invention. In FIG. 1, reference numeral 1 designates an input terminal, numeral 2 a subtractor, numeral 4 an adder, numeral 7 a subtractor, numeral 3 a 1H delay circuit, numeral 5 a limiter circuit, numerals 6, 8 coefficient circuits each for multiplying a signal by a coefficient, and numeral 9 an output terminal.

An input signal inputted from the input terminal 1 is transmitted to a positive (+) input terminal of the subtractor 2, the adder 4 and a positive (+) input terminal of the subtractor 7. An output signal of the subtractor 2 passes through the 1H delay circuit 3 where it is delayed by 1H, and then transmitted to the adder 4. An output signal of the adder 4 is transmitted to the limiter circuit 5 where it is subjected to amplitude limiting. An output signal of the limiter circuit 5 is transmitted through the coefficient circuit 8 having a coefficient K1=K to a negative (−) input terminal of the subtractor 2, and at the same time transmitted through the coefficient circuit 6 having a coefficient K2=(1+K)/2 to a negative (−) input terminal of the subtractor 7. The subtractor 7 subtracts an output signal of the coefficient circuit 6 from the input signal to obtain a subtracted signal which is transmitted as an output signal of the comb filter to the output terminal 9.

Figure 2:
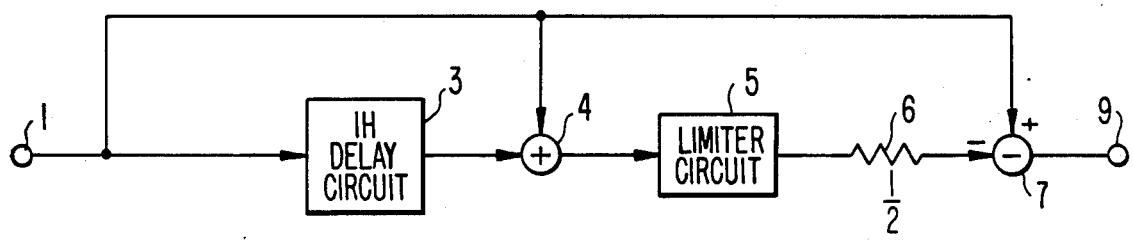
FIG. 2 is a block diagram of a second embodiment of the invention.

Operation of this comb filter when used in a color signal processing circuit will be described referring to FIGS. 1, 2 and 3.

First, a case that the vertical correlation of a color signal is large will be explained. A vertical correlation signal which is an output signal of the adder 4 contains only a small signal component, so that it is not at all affected by the limiter circuit 5. Transfer function G of the comb filter in this case is represented as follows:

$$G=(1-Z)(1-K)/\{2\times(1+KZ)\}$$

where $Z=\exp(-j\omega t)$

Figure 12:
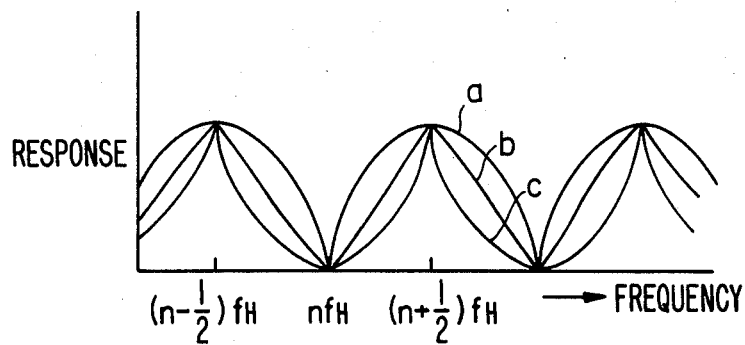
FIG. 12 is a frequency characteristic diagram of the comb filter in FIG. 11.

Frequency characteristic in this case varies depending on the feedback amount K as shown in FIG. 12.

When K=0, the frequency characteristic becomes that of a conventional comb filter (a in FIG. 12) and the S/N improvement effect is about 3 dB. When K=0.5 (b in FIG. 12), the S/N improvement effect becomes about 6 dB. When K=0.8 (c in FIG. 12), the S/N improvement effect becomes about 10 dB.

That is, although the S/N improvement effect of the conventional comb filter is about 3 dB, it becomes about 10 dB when K=0.8, for example, which is a significant improvement. Further, in this case, since the vertical correlation is large, no visible color leakage is produced.

Next, a case that the vertical correlation of the color signal is very small will be explained. The amplitude of the vertical correlation signal is large in this case, so that the vertical correlation signal is almost completely limited by the limiter circuit 5 and substantially no signal is transmitted to the subtractor 7. The transfer function G of the comb filter in this case becomes as:

$$G\approx 1.$$

Therefore, the input signal is outputted as it is, and no color leakage in the vertical direction is produced.

The invention may be described also in the following manner. FIG. 3 shows the frequency characteristic of the comb filter of the invention when the input signal level is taken into consideration.

Figure 3:
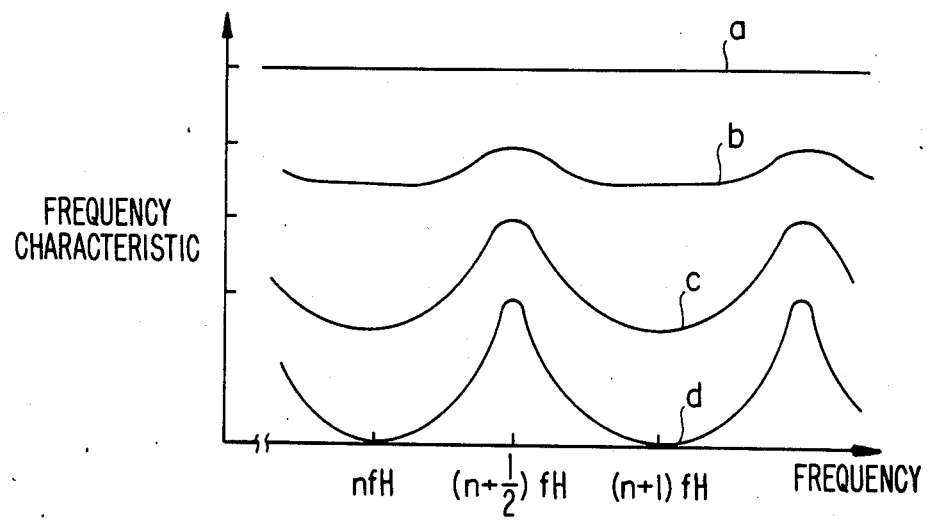
FIG. 3 is a frequency characteristic diagram for explaining the first embodiment.

At a small signal level where much noises exist, as shown by d in FIG. 3, the S/N is improved by the effect of the feedback type comb filter, and the existing color leakage in the vertical direction is scarcely visible because the signal level is small. At a large signal level where the S/N is inherently good, as shown by a in FIG. 3, although there is no S/N improvement effect, no color leakage in the vertical direction is produced. In the similar manner, the frequency characteristic varies as shown by b and c in FIG. 3 according to the input signal level.

When K=0 in the first embodiment, it is equivalent to the case that the feedback circuit is eliminated. In this case, the subtractor 2 and the coefficient circuit 8 become unnecessary, so that the circuit scale is reduced. This state is shown in FIG. 2 as a second embodiment.

Figure 4:
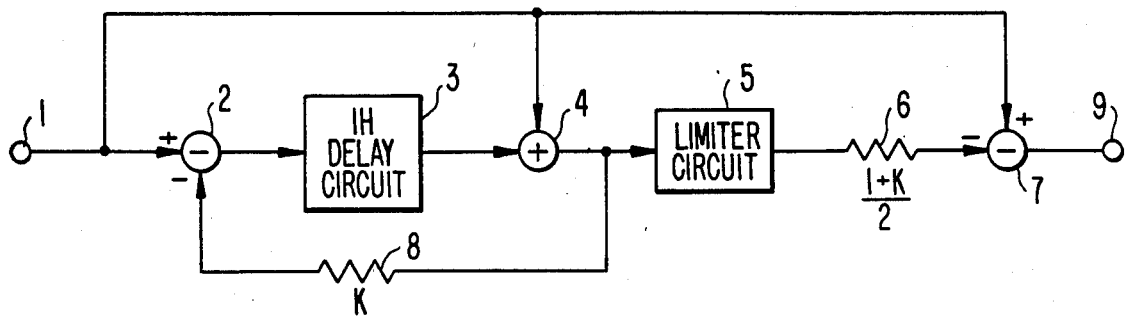
FIG. 4 is a block diagram of a third embodiment of the invention.

In a third embodiment as shown in FIG. 4, the vertical correlation signal from the adder 4 may be fed back to the subtractor 2 without passing through the limiter circuit 5. However, the third embodiment is inferior to the first embodiment in the effect to reduce the color shift in the vertical direction. The reason will be briefly described.

When the output signal of the adder 4 is fed back to the subtractor 2 without passing through the limiter circuit 5, the transfer function G1 before the limiter circuit 5 becomes as follows:

$$G1=(1+Z)/(1+KZ)$$

irrespective of whether or not the vertical correlation of the color signal exists. Consequently, it is understood that the feedback loop always acts.

On the other hand, when the output signal of the adder 4 is fed back to the subtractor 2 through the limiter circuit 5 as the first embodiment, the transfer function G1 when the vertical correlation of the color signal exists becomes as follows:

$$G1=(1+Z)/(1+KZ)$$

similarly to the above. However, when there is no vertical correlation of the color signal, since the feedback signal is limited to be $K\approx 0$, the transfer function G1 becomes as follows:

$$G1\approx 1+Z$$

similarly to a simple conventional comb filter. In other words, if there is no vertical correlation of the color signal, the feedback loop does not act.

A minute signal which is not limited by the limiter circuit 5 when no vertical correlation of the color signal exists is combined with the input signal at the subtractor 7 and then outputted to produce a slight color leakage. It is preferable that even this slight color leakage is not produced. In other words, when there is no vertical correlation of the color signal, it is preferable that the feedback loop does not act. Therefore, the arrangement that the output signal of the adder 4 is fed back to the subtractor 2 through the limiter circuit 5 as the first embodiment is preferable to that the output signal of the adder 4 is fed back without passing through the limiter circuit 5.

Figure 5:
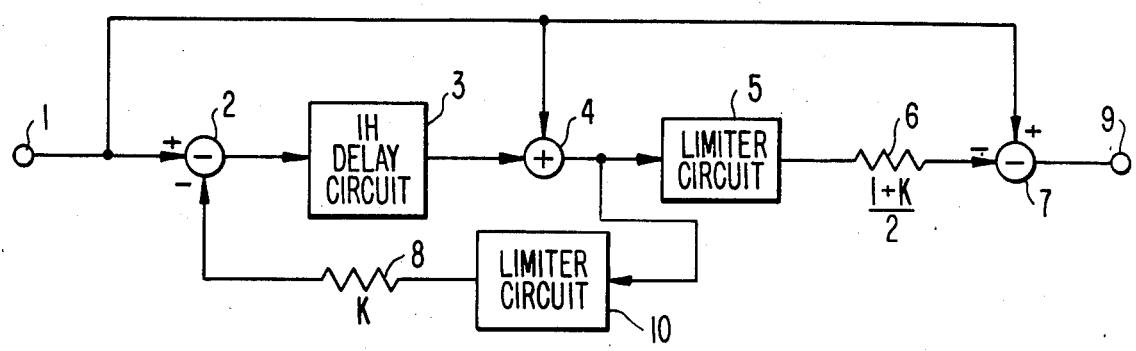
FIG. 5 is a block diagram of a fourth embodiment of the invention.

In a fourth embodiment as shown in FIG. 5, limiter circuits may be respectively inserted in a path to feed back the output signal of the adder 4 to the subtractor 2 and in a path to transmit it to the subtractor 7. This arrangement is advantageous in that the limit levels can be individually set in the both pathes.

When the above described embodiments are constructed by actual analog circuit elements, since a slight time delay would be produced in the limiter circuit or the coefficient circuit, the transfer function G of the comb filter would not accurately become as:

$$G=(1-Z)(1-K) / \{2\times(1+KZ)\}.$$

Thus, the characteristic of the comb filter would be deteriorated.

However, according to the next described arrangements, even if the slight time delay is produced in the limiter circuit or the coefficient circuit, the characteristic of the comb filter can be compensated.

Figure 7:
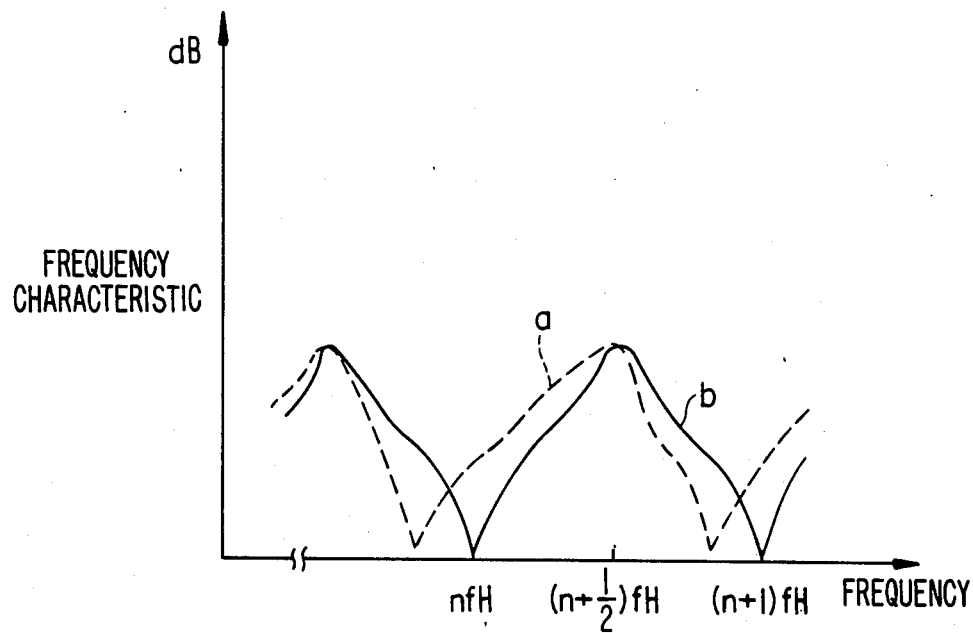
FIG. 7 is a frequency characteristic diagram for explaining the fifth embodiment.
Figure 6:
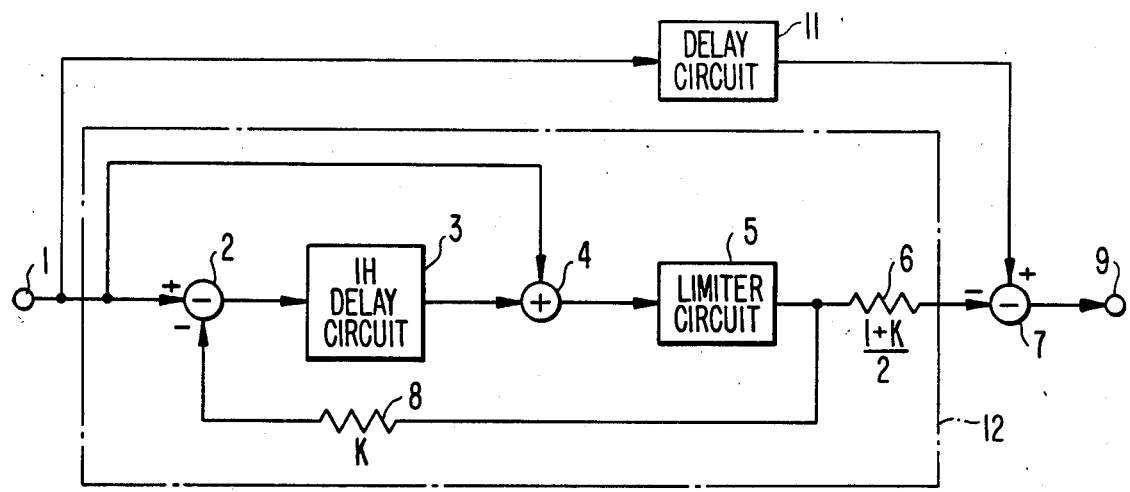
FIG. 6 is a block diagram of a fifth embodiment of the invention.

A fifth embodiment of the invention will be described referring to FIGS. 6 and 7.

Assuming that a time delay t1 is produced in an internal element such as the limiter circuit 5 and the coefficient circuit 6 of the feedback type comb filter, and that no time delay is produced at a delay circuit 11, the transfer function G of the comb filter becomes as follows:

$$G=1-D\times(1+Z)(1+K)/\{2(1+KZ)\}$$

where $D=\exp(-j\omega t1)$. The frequency characteristic in this case becomes as shown by a in FIG. 7, for example, in which node positions of the characteristic curve are shifted.

If the delay time of the delay circuit 11 is made t1, the time delay t1 produced in the limiter circuit or the coefficient circuit can be canceled. In other words, the transfer function G becomes as follows:

$$G=D\times[1-(1+Z)\cdot(1+K)/\{2(1+KZ)\}]$$

where $D=\exp(-j\omega t1)$. The output signal as a whole is delayed by t1, but the frequency characteristic in this case become as shown by b in FIG. 7, for example, and the node positions of the curve b are compensated to be at positions of integer times of fH. Where fH represents horizontal frequency, and n in FIG. 7 represents integer.

That is, the input signal is inputted to the delay circuit 11 having a delay time corresponding to that in the comb filter, and the output signal of the delay circuit 11 and the output signal of the limiter circuit within the comb filter are inputted to the subtractor 7, whereby the characteristic of the comb filter can be compensated.

Figure 8:
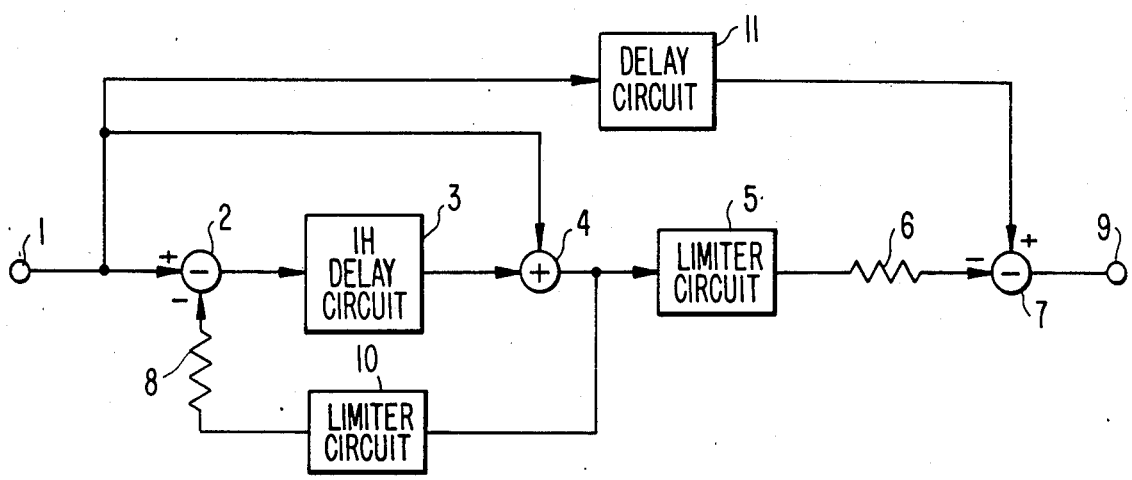
FIGS. 8 through 10 are block diagrams of other embodiments of the invention respectively.
Figure 9:
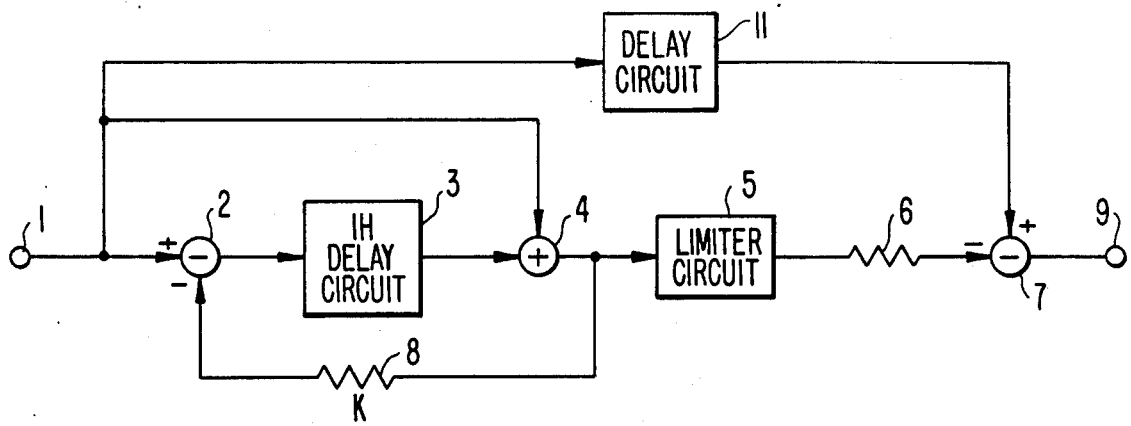
Figure 10:
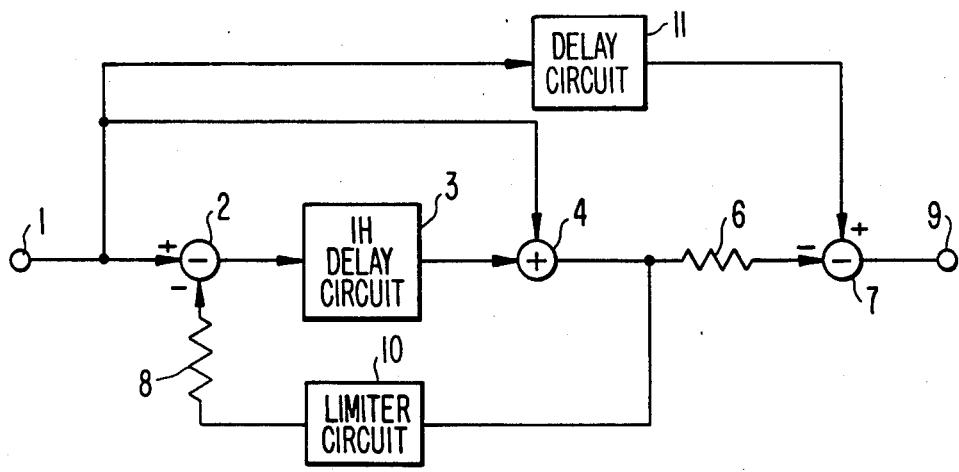
Figure 11:
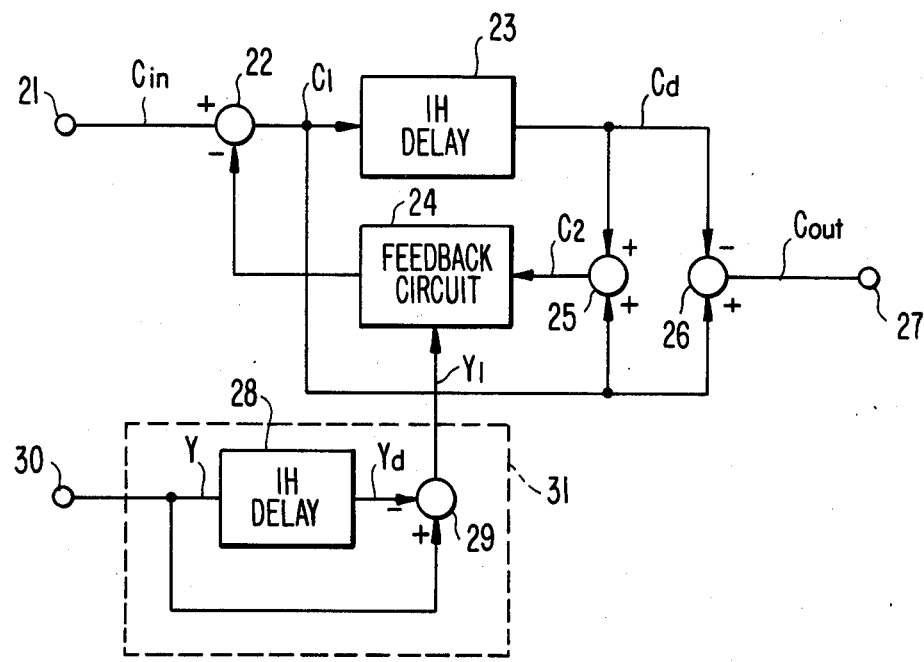
FIG. 11 is a block diagram of a feedback type comb filter in the prior art.

Examples of various modifications of the fifth embodiment are shown in FIGS. 8, 9 and 10.

As shown in FIG. 8, two limiter circuits 5 and 10 may be used. Or, as shown in FIG. 9, the feedback may be performed from the stage before the limiter circuit 5 to the subtractor 2.

As shown in FIG. 10, when the limiter circuit 10 is inserted only in the feedback path of the feedback type comb filter, the output of the comb filter shows the characteristic of a simple comb filter if the vertical correlation of the color signal is very small. In comparison to the first through fourth embodiments, the vertical color shift is produced by 1H but the S/N improvement effect is maintained 3 dB.

When the above described arrangements are constructed by digital circuit elements, even if a time delay of several clocks is produced in the limiter circuit or the coefficient circuit, insertion of the delay circuit 11 can compensate the time delay. The delay circuit 11 in this case may be constructed by a shift register or the like.

In the above described embodiments, although the coefficient K of the coefficient circuit 8 representing the feedback amount may be selected arbitrarily, it is preferably 0.5 to 0.8. Although the limiter level of the limiter circuit 5 also may be selected arbitrarily, it is preferably 10% to 30% of maximum amplitude of the vertical correlation signal outputted from the adder 4. Further, the value of K or the limiter level may be made variable by the recording and reproduction mode (2-hour mode and 4-hour mode in the case of VHS-VTR).

Although the signal in the above description is the NTSC signal, it may be the PAL signal. In PAL case, however, the 1H delay circuit must be replaced by a 2H delay circuit and other slight changes are naturally required.

Use of the comb filter of the invention enables not only the S/N improvement of the color signal but also the S/N improvement of the luminance signal. Since the transfer functions shown in the embodiments are based on consideration that phase of the color signal is reversed per 1H, in order to develop the invention to the luminance signal system, phase of the 1H delay circuit must be reversed and other slight changes are required. Describing this relation by using FIG. 1, phase of the delay circuit 3 may be reversed or the adder 4 may be replaced by a subtractor instead of changing the phase.

Although the coefficient circuits 6, 8 have positive coefficients in the embodiments, if they have negative coefficients such as −0.5, the subtractors 2, 7 are replaced by adders respectively.

Thus the operation circuits 2, 4 and 7 are not fixed to either an adder or a subtractor, but both are possible according to the polarity of the processed signal.

What is claimed is:

1. A feedback type comb filter comprising:
   a first operational means for operating upon an input signal and a feedback signal;
   a delay means for delaying an output signal of said first operational means by a predetermined time to obtain a delayed signal;
   a second operational means for operating upon said input signal and said delayed signal to obtain a vertical correlation signal representing a vertical correlation of said input signal;

a limiter means for limiting an amplitude of said vertical correlation signal to obtain an amplitude limited vertical correlation signal;

a first coefficient means for giving a first coefficient K1 to one of said vertical correlation signal and said amplitude limited vertical correction signal to obtain said feedback signal;

a second coefficient means for giving a second coefficient K2 to said amplitude limited vertical correlation signal; and a third operational means for operating upon said input signal and an output signal of said second coefficient means to obtain an output signal, wherein said comb filter has a comb filter characteristic when said vertical correlation of said input signal is large and allows said input signal pass as is when said vertical correlation is small.

2. A feedback type comb filter according to claim 1, wherein said first and second coefficients have a relationship expressed as $K2=(1+K1)/2$.

3. A feedback type comb filter according to claim 1, wherein said input signal is a color signal of an NTSC television signal, and said predetermined time is one horizontal scanning period.

4. A feedback type comb filter according to claim 1, wherein said input signal is a luminance signal of an NTSC television signal, and said predetermined time is one horizontal scanning period.

5. A feedback type comb filter according to claim 1, further comprising a delay means for delaying said input signal which is applied to said third operational means by a time necessary for compensating for a delay time of said output signal of said second coefficient means from said input signal.

6. A feedback type comb filter comprising:
a first operational means for operating upon an input signal and a feedback signal;

a delay means for delaying an output signal of said first operational means by a predetermined time to obtain a delayed means;

a second operational means for operating upon said input signal and said delayed signal to obtain a vertical correlation signal representing a vertical correlation of said input signal;

a limiter means for limiting an amplitude of said vertical correlation signal to obtain an amplitude limited vertical correlation signal;

a first coefficient means for giving a first coefficient K1 to said amplitude limited vertical correlation signal to obtain said feedback signal;

a second coefficient means for giving a second coefficient K2 to said amplitude limited vertical correlation signal; and a third operational means for operating upon said input signal and an output signal of said second coefficient means to obtain an output signal, whereby said comb filter has a comb filter characteristic when said vertical correlation of said input signal is large and allows said input signal pass as is when said vertical correlation is small.

7. A feedback type comb filter according to claim 6, wherein said first and second coefficients have relationship expressed as $K2=(1+K1)/2$.

8. A feedback type comb filter according to claim 6, wherein said input signal is a color signal of an NTSC television signal, and said predetermined time is one horizontal scanning period.

9. A feedback type comb filter according to claim 6, wherein said input signal is a luminance signal of an NTSC television signal, and said predetermined time is one horizontal scanning period.

10. A feedback type comb filter according to claim 6, further comprising a delay means for delaying said input signal which is applied to said third operational means by a time necessary for compensating for a delay time of said output signal of said second coefficient means from said input signal.

11. A feedback type comb filter comprising:
a first operational means for operating upon an input signal and a feedback signal;

a delay means for delaying an output signal of said first operational means by a predetermined time to obtain a delayed signal;

a second operational means for operating upon said input signal and said delayed signal to obtain a vertical correlation signal representing a vertical correlation of said input signal;

a limiter means for limiting an amplitude of said vertical correlation signal to obtain an amplitude limited vertical correlation signal;

a first coefficient means for giving a first coefficient K1 to said vertical correlation signal from said second operational means;

a second coefficient means for giving a second coefficient K2 to said amplitude limited vertical correlation signal; and a third operational means for operating upon said input signal and an output signal of said second coefficient means to obtain an output signal, whereby said comb filter has a comb filter characteristic when said vertical correlation of said input signal is large and allows said input signal pass as is when said vertical correlation is small.

12. A feedback type comb filter according to claim 11, wherein said first and second coefficients have a relationship expressed as $K2=(1+K1)/2$.

13. A feedback type comb filter according to claim 11, wherein said input signal is a color signal of an NTSC television signal, and said predetermined time is one horizontal scanning period.

14. A feedback type comb filter according to claim 11, wherein said input signal is a luminance signal of an NTSC television signal, and said predetermined time is one horizontal scanning period.

15. A feedback type comb filter according to claim 11, further comprising a delay means for delaying said input signal which is applied to said third operational means by a time necessary for compensating for a delay time of said output signal of said second coefficient means from said input signal.

16. A feedback type comb filter comprising:
a first operational means for operating upon an input signal and a feedback signal;

a delay means for delaying an output signal of said first operational means by a predetermined time to obtain a delayed signal;

a second operational means for operating upon said input signal and said delayed signal to obtain a vertical correlation signal representing a vertical correlation of said input signal;

first and second limiter means for limiting an amplitude of said vertical correlation signal to obtain first and second amplitude limited vertical correlation signals, respectively;

a first coefficient means for giving a first coefficient K1 to said first amplitude limited vertical correlation signal to obtain said feedback signal;

a second coefficient means for giving a second coefficient K2 to said second amplitude limited vertical correlation signal; and a third operational means for operating upon said input signal and an output signal of said second coefficient means to obtain an output signal, whereby said comb filter has a comb filter characteristic when said vertical correlation of said input signal is large and allows said input signal pass as is when said vertical correlation is small.

17. A feedback type comb filter according to claim 16, wherein said first and second coefficients have a relationship expressed as $K2=(1+K1)/2$.

18. A feedback type comb filter according to claim 16, wherein said input signal is a color signal of an NTSC television signal, and said predetermined time is one horizontal scanning period.

19. A feedback type comb filter according to claim 16, wherein said input signal is a luminance signal of an NTSC television signal, and said predetermined time is one horizontal scanning period.

20. A feedback type comb filter according to claim 16, further comprising a delay means for delaying said input signal which is applied to said third operational means by a time necessary for compensating for a delay time of said output signal of said second coefficient means from said input signal.

* * * * *